(12) United States Patent
Ulrich et al.

(10) Patent No.: US 6,436,587 B1
(45) Date of Patent: Aug. 20, 2002

(54) METHOD OF MAKING A MULTI-LEVEL RETICLE USING BI-LEVEL PHOTORESIST, INCLUDING A PHASE-SHIFTED MULTI-LEVEL RETICLE

(75) Inventors: Bruce Dale Ulrich, Beaverton, OR (US); Gerald William Maliszewski, San Diego, CA (US)

(73) Assignee: Sharp Laboratories of America, Inc., Camas, WA (US)

( * ) Notice: Subject to any disclaimer, the term of this patent is extended or adjusted under 35 U.S.C. 154(b) by 36 days.

(21) Appl. No.: 09/665,236

(22) Filed: Sep. 18, 2000

(51) Int. Cl.[7] .................................................. G03F 9/00
(52) U.S. Cl. ........................................................ 430/5
(58) Field of Search ............................ 430/5, 322, 324, 430/311, 313

(56) References Cited

U.S. PATENT DOCUMENTS

| | | | |
|---|---|---|---|
| 5,753,417 A | | 5/1998 | Ulrich .......................... 430/312 |
| 5,914,202 A | * | 6/1999 | Nguyen et al. ................. 430/5 |
| 5,936,707 A | | 8/1999 | Nguyen et al. ................. 355/18 |

* cited by examiner

*Primary Examiner*—S. Rosasco
(74) *Attorney, Agent, or Firm*—David C. Ripma; Matthew D. Rabdau; Scott C. Krieger

(57) ABSTRACT

A method of forming a reticle includes providing a reticle blank having a quartz layer, an attenuated phase shift layer, and a metal layer; covering the reticle blank with photoresist; patterning the photoresist into multiple levels; and etching the reticle blank according to the multi-level photoresist pattern.

14 Claims, 7 Drawing Sheets

METHOD OF MAKING A MULTI-LEVEL RETICLE USING BI-LEVEL PHOTORESIST, INCLUDING A PHASE-SHIFTED MULTI-LEVEL RETICLE

RELATED APPLICATIONS

U.S. Pat. No. 5,753,417, granted May 19, 1998, for "Multiple Exposure Masking System For Forming Multi-Level Resist Profiles." A reticle for forming a multi-level photoresist pattern suitable for use with the present invention is disclosed in U.S. Pat. No. 5,936,707, granted Aug. 10, 1999, for "Multi-Level Reticle System and Method for Forming Multi-level Resist Profiles."

FIELD OF THE INVENTION

This invention relates generally to integrated circuit processes and fabrication, and more particularly to a method for forming a multi-level reticle from a bi-level photoresist and for forming a phase-shifted, multi-level reticle for use in photo lithography.

BACKGROUND OF THE INVENTION

The demand for progressively smaller and more powerful electronic products requires smaller geometry integrated circuits (ICs) formed on large substrates. It also creates a demand for a denser packing of circuits onto IC substrates. The requirement for smaller geometry IC circuits means that the interconnections between components and dielectric layers must be as small as possible.

Research into techniques to accomplish the forgoing has focused on various conductive and fabrication methods. Copper is a natural choice to replace aluminum, as copper has a conductivity approximately twice that of aluminum, and over three times that of tungsten. The same current may be carried through a copper line having half the cross-section of an aluminum line, and the electromigration characteristics of copper are also much superior to those of aluminum: copper is approximately ten times better than aluminum with respect to electromigration. As a result, a copper line, even one having a much smaller cross section than an aluminum line, is able to maintain electrical and mechanical integrity.

However, there are problems in the use of copper in IC processing. Copper pollutes many of the materials used in IC processes. Care must be taken to keep copper from migrating into these materials. Copper is especially prone to oxidation, especially during oxygen etch processes. Care must be take to protect copper from exposure during etching, annealing, and other high temperature processes. The oxidation products of copper are difficult to remove. Copper cannot be deposited onto substrates using the same processes as for depositing aluminum, so new deposition processes have been developed to deposit copper lines and interconnects in IC inter-level dielectrics.

Forming a copper conductor in an IC is also difficult, particularly in small geometries. It is impractical to sputter metal, either copper or aluminum, to fill small diameter vias, as both metals have poor gap filling capability. Chemical vapor deposition (CVD) has been used to deposit copper. Once deposited, however, conventional etching process methods cannot be used because the low volatility of copper etch products requires copper to be removed (vaporized) at relatively high temperatures, approximately 250° C., which temperature will melt photoresist masks. Because of its oxidation properties, cooper cannot be removed with a plasma etch. Wet etches are isotropic, and are too imprecise for many applications. Therefore, a process to form a via using CVD without etching the copper has been developed, and is called the inlay, or damascene, process.

The damascene process for forming a via between a substrate surface and an overlying dielectric surface is described below. The underlying substrate surface is first completely covered with a dielectric, such as oxide. A reticle is a "hard copy" of a portion of the circuit architecture formed in a thin layer of chrome on a glass or quartz substrate. The reticle may be used directly, or may be used to form a photo mask. A patterned photoresist pattern is then formed over the oxide. The photoresist pattern has an opening, or hole, in the photoresist corresponding to the area in the oxide where the via is to be formed. Other areas of the oxide to be left in place are covered with photoresist. The photoresist covered dielectric is then etched to remove oxide underlying the hole in the photoresist. The photoresist is then stripped away. CVD copper is then used to fill the via. A layer consisting of oxide with a copper via through it now overlies the substrate surface. The excess copper remaining is removed with a chemical mechanical polish (CMP) process, as is well known in the art.

Refinements in the damascene process are ongoing. One refinement is the dual damascene method. In the dual damascene method, vias, interconnects, and lines are formed in a dielectric at two different levels. In terms of the example of the damascene process in the preceding paragraph, the dual damascene process adds a second via, or interconnecting line, in the deposited oxide that extends from the new (oxide) surface to a level in the oxide between the underlying substrate surface and the new (oxide) surface. The dual damascene method is described in greater detail later herein, and in FIGS. 1 through 6.

One known method of performing the dual damascene process is through multiple photoresist mask and etch steps. A single level photoresist pattern is formed on a layer of deposited dielectric and a via pattern is formed by etching to a first inter-level in the dielectric material. At this point in the process the via is only partially etched. The photoresist is then stripped and a second, single-layer photoresist pattern is formed on the dielectric surface to form an interconnect pattern to a second inter-level in the dielectric material. Coincident with etching the interconnect, the via is etched such that interconnects in underlying substrate layers are exposed to allow electrical contact. Aligning the photoresist patterns is a problem using this method. If the two photoresist patterns are not aligned correctly, then intersecting features in the dielectric material will be misaligned. That is, a conductive line associated with the first photoresist pattern may not correctly intersect a via associated with the second photoresist pattern. Alignment errors may be corrected by making the intersecting features oversized, however, this defeats the purpose of reducing the size of connecting lines and vias. Alignment problems reduce yields, and increase the cost and the complexity of IC manufacturing processes.

Another known method of performing the dual damascene process uses photoresist patterns having multiple levels, or thicknesses, to form vias and interconnect at multiple levels in an IC dielectric. An electron beam, or laser, may be used to directly write a multi-level pattern into photoresist, but this technique is not commercially practical. So called "gray-tone" masks, formed from repetitive patterns of dots that appear as transparent holes on the chromium mask of the reticle, have also been used to form multi-level photoresist patterns, as described by Pierre Sixt, "Phase Masks and Gray-Tone Masks", Semiconductor FabTech, 1995, page 209. Sixt also provides a general description of a process to transfer the multi-level photoresist onto a dielectric. The process relies on a one-to-one etch selectivity between the dielectric material and the photoresist material. The dielectric and the overlying photoresist pattern are then simultaneously etched, with any exposed dielectric material etched at the same rate as overlying photoresist material. Thinner layers of photoresist produce a deeper etch in the dielectric so that, after etching, the dielectric shape generally resembles the photoresist pattern overlying the dielectric at the beginning of the process.

One problem with this method is finding dielectric materials and photoresist materials that have identical etch selectivity. It is also difficult to transfer some types of features, especially small or relatively complicated features, into a dielectric using this method. Polymers and by-products of the etch process tend to collect on areas of the photoresist pattern, changing the shape and etch rates of the photoresist pattern. Further, the Sixt article states that vias made by this method have a relatively large size, approximately 25 μm, due to the resolution limits imposed by the pixel size of the gray-tone mask. Vias of this size are approximately two orders of magnitude larger than vias formed through conventional methods, and are unsuited for most IC processes. A goal for VLSI structures is a via having a depth of about 1.5 μm, and a width of about 0.6 μm.

A multi-level photoresist pattern suitable for use in the method of the present invention is disclosed in U.S. Pat. No. 5,753,417, granted May 19, 1998, for "Multiple Exposure Masking System For Forming Multi-Level Resist Profiles." A reticle for forming a multi-level photoresist pattern suitable for use with the present invention is disclosed in U.S. Pat. No. 5,936,707, granted Aug. 10, 1999, for "Multi-Level Reticle System and Method for Forming Multi-level Resist Profiles." Both above mentioned patents are assigned to the same assignees as the instant application, and are incorporated herein by reference.

SUMMARY OF THE INVENTION

A method of forming a reticle includes providing a reticle blank having a quartz layer, an attenuated phase shift layer, and a metal layer; covering the reticle blank with photoresist; patterning the photoresist into multiple levels; and etching the reticle blank according to the multi-level photoresist pattern.

An object of the invention is to provide a method of forming vias and interconnects to at least two different inter-levels beneath the surface of an IC dielectric.

Another object of the invention is to perform a damascene process without concern for aligning a series of photoresist masks.

A further object of the invention is to provide a single photoresist pattern, having a plurality of levels, to reduce the number of steps and general complexity of the dual damascene method.

Another object of the invention is to provide a reticle which will phase shift light from a light source in order to achieve good contrast between exposed, partially exposed and unexposed regions for better resolution.

Yet another object of the invention is to provide an attenuated phase shift layer having a thickness which is a function of the light source wavelength for structures having a desired thickness and profile.

Another object of the invention is to provide a multi-level photoresist pattern to achieve the via widths and feature resolutions of conventional single level photoresist pattern etching processes.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
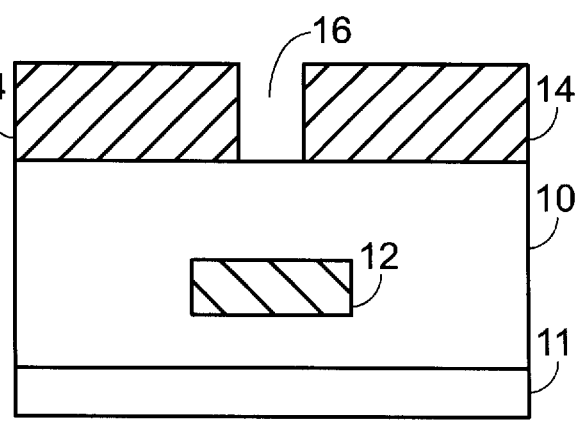
FIGS. 1–6 are partial cross-sectional views of sequential steps in the formation of an IC inter-level dielectric of the prior art.
Figure 2:
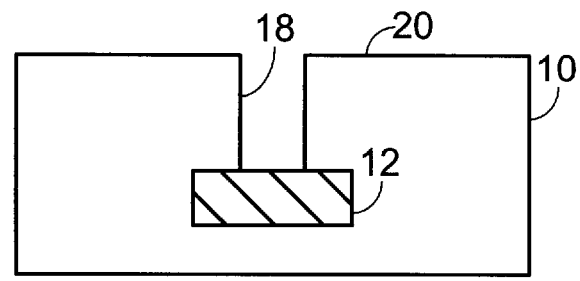

FIGS. 1 and 2 depict a damascene method of forming a via in an IC inter-level dielectric. FIG. 1 is a partial cross-sectional view of an IC inter-level dielectric having a first overlying photoresist pattern. An IC inter-level dielectric 10 is typically composed of dielectric material such as an oxide. Dielectric 10 overlies a substrate 11, typically of silicon, and has a connecting area 12, also referred to herein as a first inter-level, composed of a metal or semiconductor material. Alternately, connection area 12 is located at the surface of substrate 11. A photoresist pattern 14 overlying dielectric 10 has an opening 16.

FIG. 2 is a partial cross-sectional view of IC dielectric 10 of FIG. 1 with a via 18 formed from the surface to connection area 12 at a first inter-level in dielectric 10. After stripping photoresist pattern 14, a surface 20 of dielectric 10 is exposed.

Figure 3:
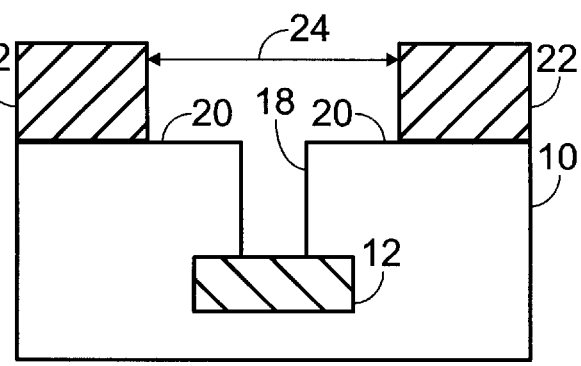

FIGS. 3 through 6, together with FIGS. 1 and 2, depict a dual damascene process. FIG. 3 is a partial cross-sectional view of IC dielectric 10 of FIG. 2 with a second overlying photoresist pattern 22. Photoresist pattern 22 has an opening 24 to expose surface area 20.

Figure 4:
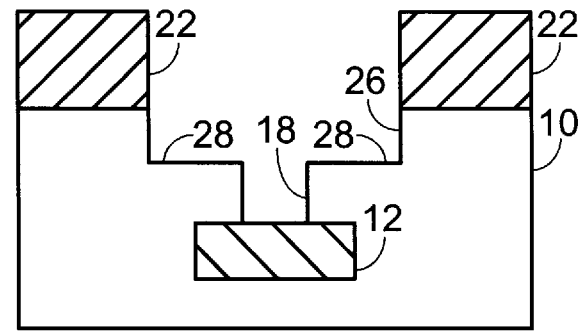
Figure 5:
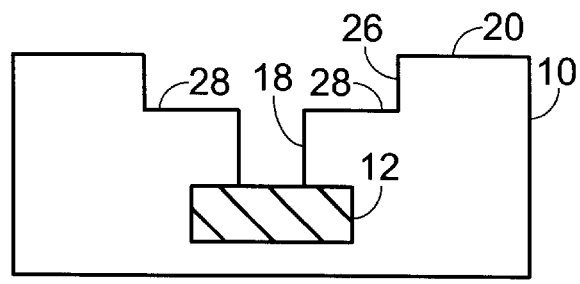

FIG. 4 is a partial cross-sectional view of IC dielectric 10 of FIG. 3 with opening 26 formed in dielectric 10 to a second inter-level 28. FIG. 5 is a partial cross-sectional view of IC dielectric 10 of FIG. 4 with overlying photoresist pattern 22 stripped away.

Figure 6:
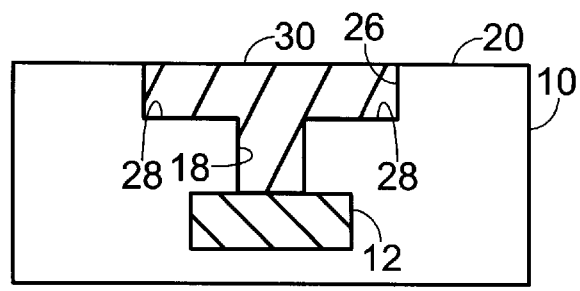

FIG. 6 is a partial cross-sectional view of IC dielectric 10 of FIG. 5 filled with a conductive material 30 to connect surface 20 to inter-levels 28 and 12 in IC dielectric 10. Typically, the opening to inter-level 28 is a line intersecting via 18, and so, electrically communicating to connection area 12, and to other vias and connection areas, not shown, on dielectric 10. FIGS. 4–6 display via 18 in the center of the opening to inter-level 28. Via 18 is centered because second photoresist pattern 22 is aligned correctly with first photoresist pattern 14. The correct alignment of photoresist patterns is critical in the dual damascene process and often requires oversized vias and lines in commercial processes to guarantee intersections. In normal commercial process it is almost impossible to intersect interconnects on two inter-levels unless at least one of the interconnects is oversized. The phase-shifted multi-level reticle of the invention resolves this problem. The use of a bi-level reticle provides a single step pattern transfer, whether such transfer is to another reticle, or to an IC substrate. Changing the thickness of an attenuated phase shift (APS) layer changes the amount of phase shift of light originating at an exposing light source, thereby controlling the profile of structures patterned with masking.

Multi-level Reticle

Figure 7:
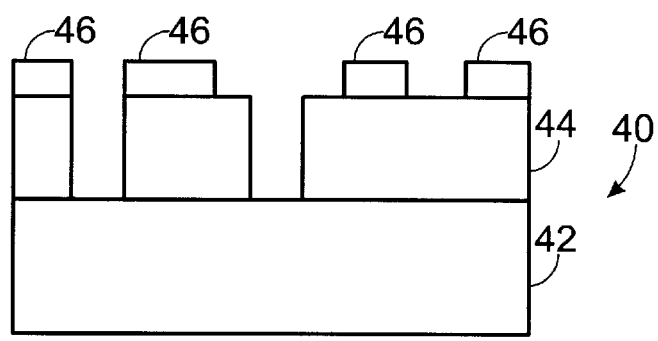
FIGS. 7–13 are partial cross-sectional views of sequential steps in the formation of an IC inter-level dielectric using a multi-level reticle using bi-level photoresist.
Figure 8:
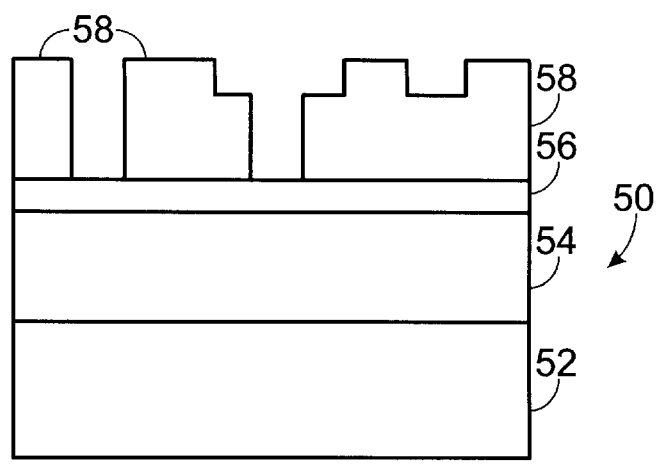

The first portion of the method of the invention includes forming a multi-level reticle using bi-level photoresist. Referring now to FIG. 7, a master reticle is depicted generally at 40. Reticle 40 includes a quartz layer 42, an APS layer, usually formed of molysiliconoxynitride (MoSiON), 44, and a Cr/CrO layer 46. Exposing a second reticle blank 50, using master reticle 40, results in a structure having a quartz layer 52, APS layer 54, and a Cr/CrO layer 56, and a photoresist layer 58, as shown in FIG. 8. In one embodiment, this is all which is required: a multi-level reticle is used to produce a multi-level reticle.

Figure 9:
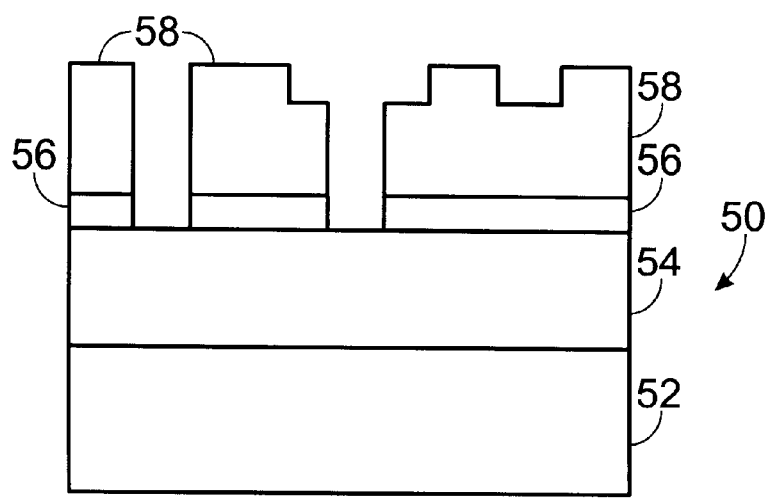
Figure 10:
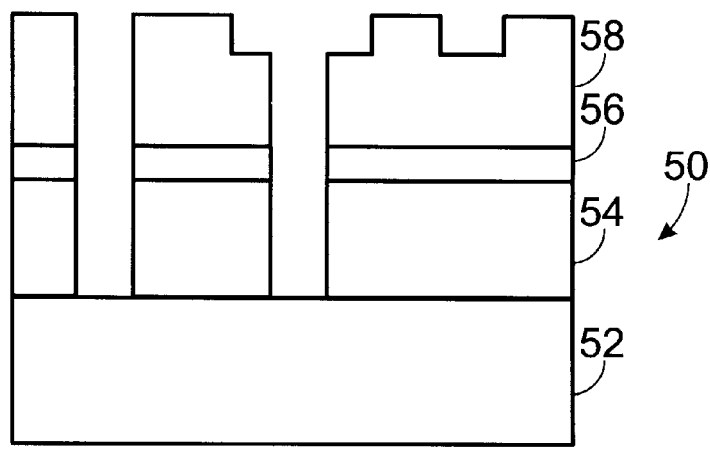
Figure 11:
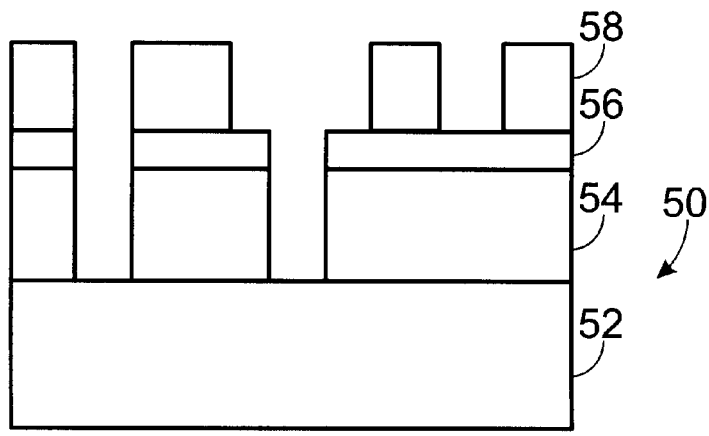

Following etching of Cr/CrO layer 56, to form a more complex multi-level reticle using multiple exposures and multiple steps, the structure shown in FIG. 9 is produced. As shown in FIG. 10, APS layer 54 is next etched, followed by etching of photoresist layer 58, as shown in FIG. 11.

Figure 12:
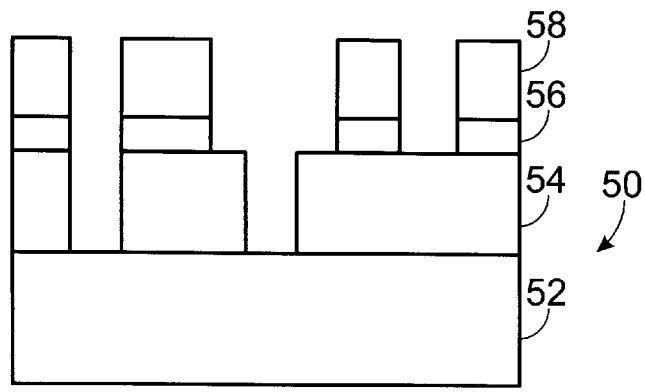
Figure 13:
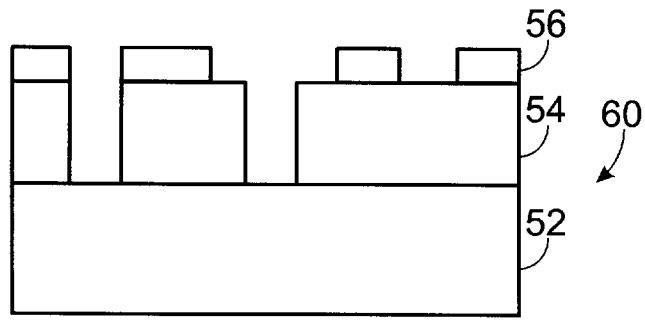

Cr/CrO layer 56 is next etched according to the pattern of photoresist layer 58, resulting in the structure of FIG. 12. Finally, as shown in FIG. 13, photoresist layer 58 is removed, resulting in second reticle 60, which is in working condition. Bi-level photoresist mask 58, having three thicknesses, enables a single step light exposure, developing and etching process to form second reticle 60, also having three thicknesses. Reticle 60 may, in turn, be used to form a bi-level photoresist mask.

Phase Shifting

Phase shifting may be used to further enhance the properties of reticles produced according to the method of the invention. Prior art phase shifting has been used to provide a steeper photoresist wall angle; a smaller critical dimension (CD); and better control of the CD. There is, however, a disadvantage when line-to-line spacing is at a minimum: the interference of the exposing light from a neighboring line pattern may lessen the aforementioned enhancements. A Levenson-type phase shifting, where alternate line/space pairs are phase shifted by 180°, is applied during practice of the invention to enhance the properties of the ICs manufactured thereby.

The method of the invention provides a steeper photoresist wall angle; a smaller CD; and better CD control of minimally spaced line patterns by 180° phase shifting of alternating line patterns, similar to Levenson-type phase shifting. The single line pattern pair will keep its 90° phase shift, i.e., a 0° phase shifted aperture one is located adjacent a 90° phase shifted aperture two. The neighboring line pattern pair is shifted by 180°; that is, a 180° aperture one is adjacent a 270° phase shifted aperture two. Thereby the reticle has apertures phase shifted by 0°, 90°, 180°, and 270°. Although phase shifting is depicted as a single line pattern in the figures, it will be understood by those of ordinary skill in the art that all line patterns have similar phase shifts.

Figure 14:
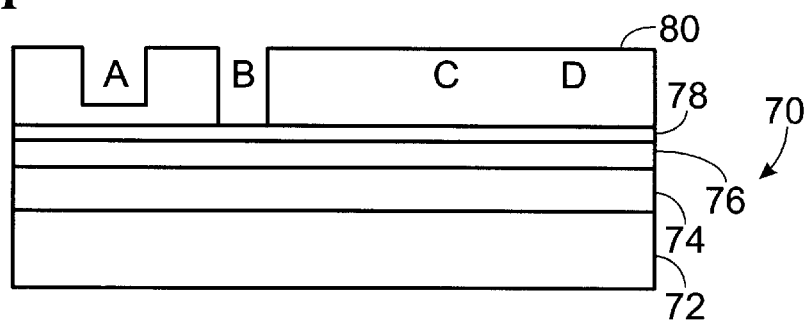
FIGS. 14–23 are partial cross-sectional views of sequential steps in the formation of an IC inter-level dielectric using a phase shifted multi-level reticle using bi-level photoresist.

Referring now to FIG. 14, a reticle blank is depicted generally at 70. Blank 70 includes a quartz layer 72, an APS layer 74, a phase shift layer 76, and a Cr/CrO layer 78. A first layer of bi-level photoresist 80 is formed on reticle blank 70. The letters, A, B, C, and D refer to regions which are to be phase shifted by a specific amount, which amount is in multiples of 90°.

Figure 15:
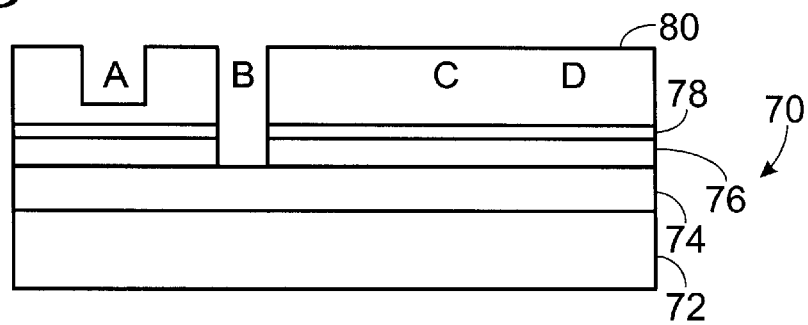
Figure 16:
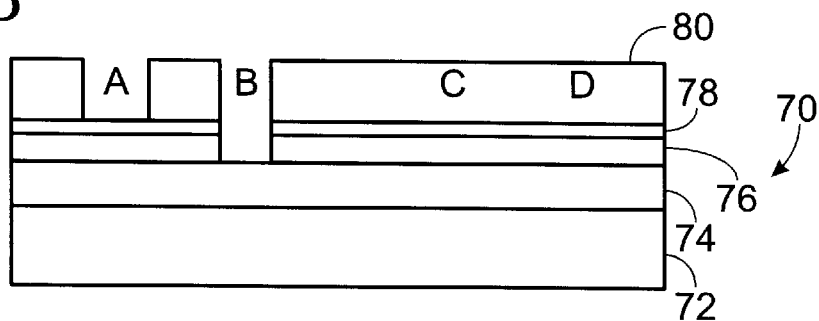
Figure 17:
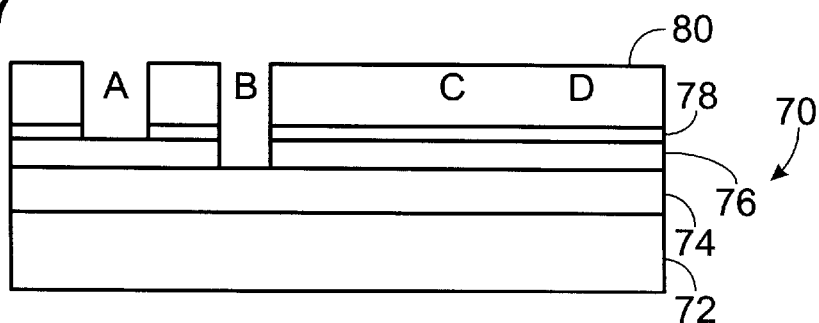

Turning now to FIG. 15, Cr/CrO layer 78 and phase shift layer 76 are etched in region B. Next, referring to FIG. 16, first bi-level photoresist 80 is etched in region A. FIG. 17 depicts the results of etching Cr/CrO layer 78 in region A.

Figure 18:
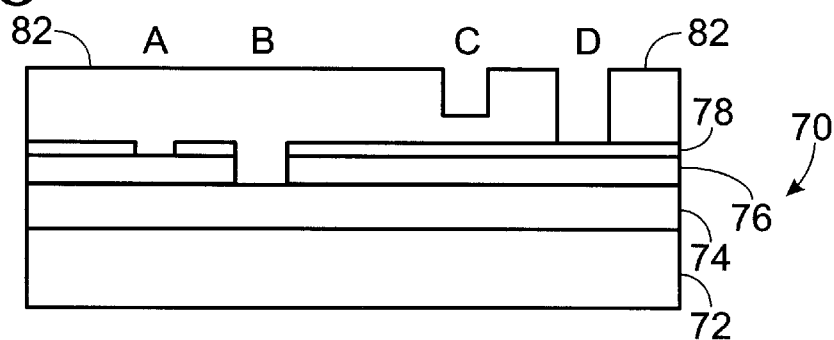
Figure 19:
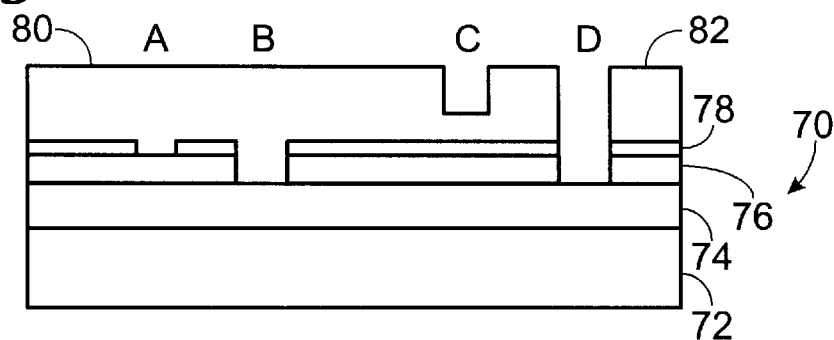

First bi-level photoresist 80 is next removed, and a second bi-level photoresist mask 82 is deposited, as shown in FIG. 18. Cr/CrO layer 78 is etched in region D, as is phase shift layer 76, as shown in FIG. 19.

Figure 20:
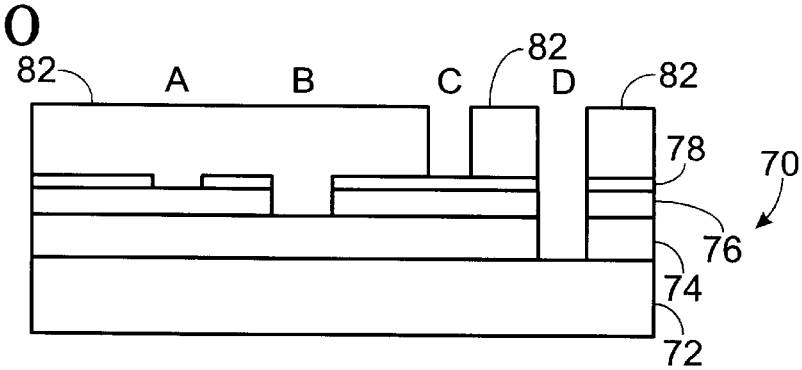
Figure 21:
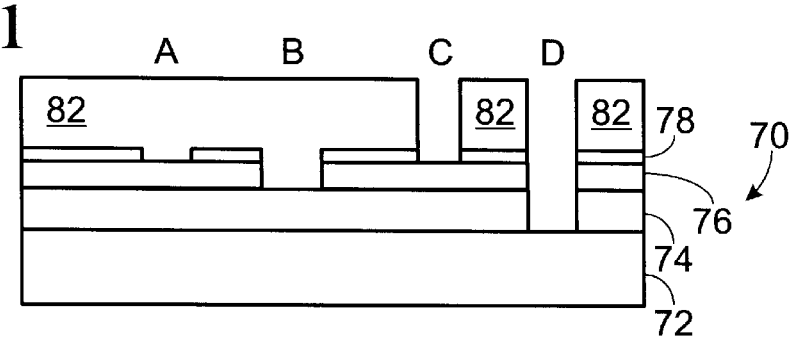
Figure 22:
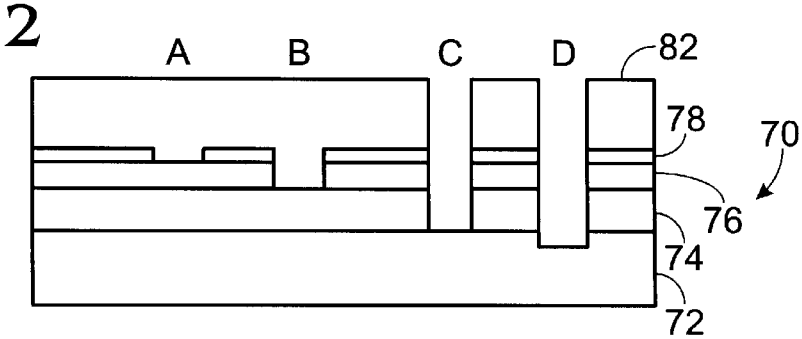

As shown in FIG. 20, second bi-level photoresist mask 82 is etched in region C and APS layer 74 is etched in region D. Cr/CrO layer 78 is next etched in region C, as shown in FIG. 21. FIG. 22 depicts the results of etching, seriatim, phase shift layer 76 in region C, quartz layer 72 in region D, and APS layer 74 in region C.

Figure 23:
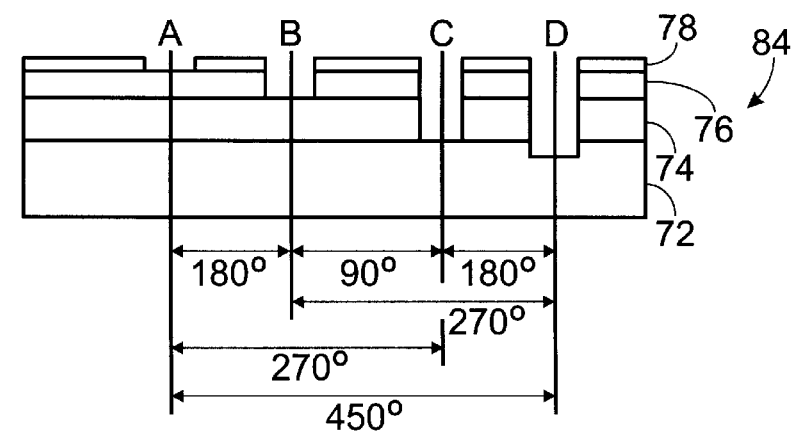

The final profile of a completed reticle 84 is depicted in FIG. 23, after second bi-level photoresist mask 82 has been removed. The use of the reticle is to form a "bi-level" photoresist pattern to be used in pattern transferring into a wafer. Particularly during the formation of a damascene pattern for metalization of lines and vias.

Thus, the method of the invention uses two steps of light exposure-developing-/etching to form a reticle having five thicknesses. One of the thicknesses, the Cr/CrO layer, is opaque. Two other thicknesses, A & B, have a mutual 180° phase difference. The final two thicknesses, C & D, also have a mutual 180° phase difference. Group thicknesses A & B when compared to C & D have phase shift differences of 90°+n*180°, where n=0, 1, 2, . . . etc. (e.g. 90°, 270°, 450°, . . . etc.).

FIG. 24a depicts an example layout using paired sections in a Levenson scheme.

FIG. 24b depicts a slight modification to FIG. 24a, wherein areas C & B are abutted instead of the C & A areas. FIGS. 24a and 24b have X and Y directions designated thereon.

Figure 25:
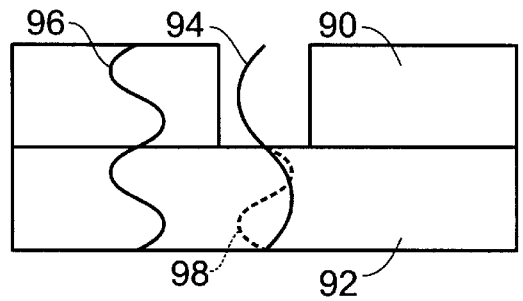
FIG. 25 depicts the relationship between source light wavelength and APS layer thickness.

Phase shifting of the light from an exposing light source results in light of a desired phase and intensity reaching a layer of the structure which is to be exposed, ultimately resulting in formation of a structure having a desired profile. Referring now to FIG. 25, a portion of a structure having an APS layer 90 and a quartz layer 92 is depicted. The wavelength of the light as it originates and reaches the structure is depicted by wave form 94, and represents $\lambda_v$, which is the wavelength in air, which is approximately the same as the wavelength in a vacuum, where the exposing occurs. Wave form 96 represents $\lambda_{med}$, or the wavelength of the light in the medium, which APS layer 90. Wave form 98 represents $\lambda_Q$, or the wavelength of the light in quartz layer 92. The phase shift is a function of the index of refraction, n, which is 1.0 in a vacuum, and approximately 1.0 in air. The index of refraction for quartz layer 98 is approximately 1.45, and is approximately 2.33 for APS layer 90.

The index of refraction is determined by the velocity (V) of light in a vacuum ($V_{vac}$) over the velocity of light in a medium ($V_{med}$). In this case, $n_Q = V_{vac}/V_{med}$, or $V_{vac} \approx 2 V_{med}$.

Figure 26:
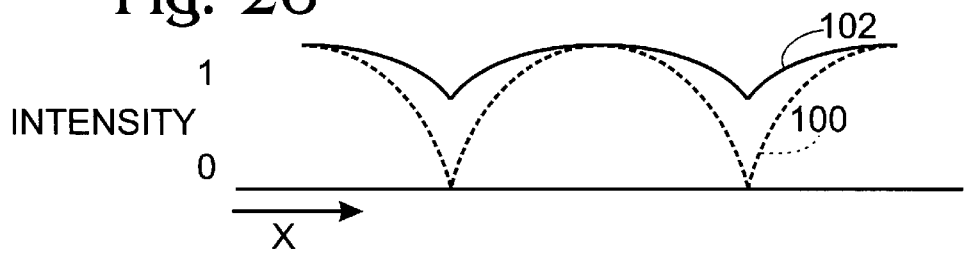
FIG. 26 depicts the relative intensities of phase shift light.

As shown by wave form 94, the index of refraction of quartz layer 92 slows and refracts the light, forming a wave form 98, which is approximately 180° out of phase with wave form 96 entering quartz layer 92 from APS layer 90. The effect of having the light 180° out of phase is shown in FIG. 26, wherein the intensity of the light passing through quartz layer 90 is depicted by trace 100, while that of light 90° out of phase is depicted by trace 102. Trace 102 reaches full intensity (1) and drops to about 50% intensity at points therealong, while trace 100 shifts between full and zero intensity. The result of trace 100 is photoresist islands of lower than desired height, which requires a thicker initial photoresist layer. The ability to control the intensity with light 90° out of phase eliminates this condition. The phase difference is modulated by changing the thickness of the medium, i e., APS layer 90, to achieve a desired intensity.

Figure 27:
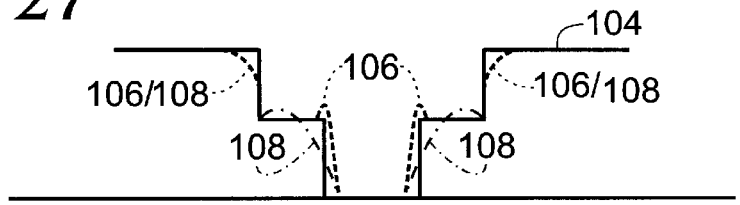
FIG. 27 depicts various structure profiles.

Referring to FIG. 27, a desired structure profile is shown at 104. the profile achieved with a 180° phase shift is shown at 106, and that of a 90° phase shift is shown at 108. In this example, a 90° phase shift produces a profile closest to that of the desired profile. In other circumstances, a 180° phase shift will produce a profile closest to the desired profile. The APS layer thickness is adjusted to provide a desired phase shift, which is in 90° increments, and usually odd-multiples of 90°. The APS layer provides a phase shift and attenuates the light intensity. An oxide layer will only provide a phase shift. In some instances, a phase shift along one exposure axis, such as X in FIG. 24, may be desired to be 180°, while a phase shift in the other, Y, direction, may be desired to be odd multiples of 90°.

The steps of the method of the invention include providing a reticle blank having a quartz layer overlaid by a phase shift layer. A photoresist pattern is deposited and patterned on the surface of the reticle blank, wherein the resist pattern has a plurality of predetermined thicknesses, and having an opening through the photoresist to expose a predetermined surface area of the reticle blank. The exposed surface areas are etched. Parts of the photoresist may be etched to create openings exposing a predetermined surface area, and leaving part of the photoresist over the surface. Etching of the reticle blank and photoresist is repeated until the desired geometry of a reticle is obtained. The remaining photoresist is then stripped. The method yields a multi-level reticle product, suitable for use in the manufacture of an integrated circuit, and which will phase shift the exposing light by a desired amount.

Figure 24:
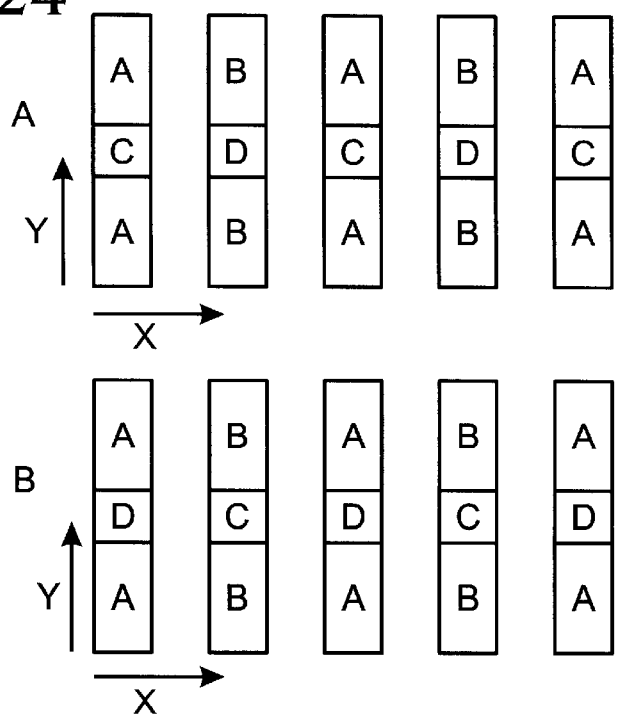
FIG. 24a is a partial top view of an architecture layout depicting alternating lines and vias having 180° phase shifts.
FIG. 24b is a partial top view of an alternate architecture layout depicting alternating lines and vias having 180° phase shifts.

Two types of reticles may be formed to practice the invention: the reticles shown herein, having five thicknesses, allow for two exposures, as shown in FIG. 24, A & B, and C & D. A three thickness reticle, having quartz, APS and Cr/CrO layers provides a single print bilevel structure, which requires a single exposure to accomplish a pattern transfer for less complex structures. Any via hole pattern adjacent a metal line is to be phase shifted by 90°, or by an odd multiple of 90°.

An optional step includes removal, at some point in time, of the entire photoresist layer, and deposition of a second photoresist layer, having a different pattern than, or the same pattern as, the original photoresist layer, but phase shifted by some predetermined amount, usually in multiples of 90°, to form a phase-shifted, multilevel reticle. It should be appreciated that multiple levels of more than three tier patterns may be formed to transfer a pattern to a substrate. This may be accomplished by providing a single tier pattern level for pattern transfer, or by providing a multiple tier pattern level for pattern transfer. In the case of a single tier pattern level, which may be visualized as FIG. 17 with Cr/CrO layer 78 and photoresist layer 80 removed, an A or B type arrangement (FIG. 24) is provided with a C or D type reticle, resulting in a reticle having layers of metal, APS and quartz, and which does not incorporate Levenson type phase shifts. A multiple tier, double patterning scheme uses an A, B, C, and D type reticle, having layers of metal, APS, PS and quartz, and which may incorporate a Levenson type phase shift.

Thus, a method for making a multi-level reticle using bi-level photoresist, including a phase-shifted multi-level reticle has been disclosed. It will be appreciated that further variations and modifications thereof may be made within the scope of the invention as defined in the appended claims.

We claim:

1. A method of forming multi-level reticles comprising:

providing a first reticle blank having a quartz layer, an attenuated phase shift layer, and a metal layer;

covering the reticle blank with photoresist;

patterning the photoresist into multiple levels;

etching the reticle blank according to the multi-level photoresist pattern to form a first reticle;

providing a second reticle black having a quartz layer, an attenuated phase shift layer, a metal layer and a patterned photoresist layer;

exposing, with a single step light exposure with the first reticle, the second reticle blank; and developing and etching the second reticle blank to form a second reticle having multiple levels.

2. The method of claim 1 wherein the photoresist is phase shifted by a predetermined amount to form a phase-shifted multi-level reticle.

3. The method of claim 2 wherein the phase shift is in multiples of ninety degrees.

4. The method of claim 1 wherein the attenuated phase shift layer is provided in a thickness which is a function of the wave length of exposing light, and which shifts the phase of the exposing light by a predetermined phase shift.

5. The method of claim 1 which further includes repatterning the photoresist into additional multiple levels and etching the reticle blank according to the repatterned multi-level photoresist as required to form a multi-level reticle.

6. The method of claim 5 wherein the photoresist is phase shifted by a predetermined amount to form a phase-shifted multi-level reticle.

7. The method of claim 6 wherein the phase shift is in multiples of ninety degrees.

8. The method of claim 6 wherein the phase shift is a Levenson-type phase shift.

9. The method of claim 5 wherein the attenuated phase shift layer is provided in a thickness which is a function of the wave length of exposing light, and which shifts the phase of the exposing light by a predetermined phase shift.

10. The method of claim 9 wherein the light is phase shifted by 180° in one direction and by odd multiples of 90° in a perpendicular direction.

11. A method of forming multi-level reticles comprising:

providing a first reticle blank having a quartz layer, an attenuated phase shift layer, and a metal layer;

covering the reticle blank with photoresist;

patterning the photoresist into multiple levels; etching the reticle blank according to the multi-level photoresist pattern to form a first reticle;

providing a second reticle black having a quartz layer, an attenuated phase shift layer, a metal layer and a patterned photoresist layer;

repatterning the photoresist on the second reticle into additional multiple levels and etching the second reticle blank according to the repatterned multi-level photoresist as required, including phase shifting the pattern by a predetermined amount to form a phase-shifted multi-level reticle, wherein the attenuated phase shift layer is provided in a thickness which is a function of the wave length of exposing light; and which shifts the phase of the exposing light by a predetermined phase shift;

exposing, with a single step light exposure with the first reticle, the second reticle blank; and developing and etching the second reticle blank to form a second reticle having multiple levels.

12. The method of claim 11 wherein the phase shift is in multiples of ninety degrees.

13. The method of claim 11 wherein the phase shift is a Levenson-type phase shift.

14. The method of claim 11 wherein the light is phase shifted by 180° in one direction and by odd multiples of 90° in a perpendicular direction.

* * * * *